United States Patent [19]

Okuya

[11] 4,293,636
[45] Oct. 6, 1981

[54] PHOTOPOLYMERIZABLE POLYESTER CONTAINING COMPOSITIONS

[75] Inventor: Ken Okuya, Tokorozawa, Japan

[73] Assignee: Tamura Kaken Co., Ltd., Iruma, Japan

[21] Appl. No.: 178,233

[22] Filed: Aug. 14, 1980

[30] Foreign Application Priority Data

Jun. 27, 1980 [JP] Japan ................................. 55-88408

[51] Int. Cl.³ ............................................... G03C 1/68
[52] U.S. Cl. ................................... 430/281; 430/285; 430/288; 430/908; 204/159.15; 204/159.16; 204/159.19
[58] Field of Search ............... 430/281, 285, 908, 288; 204/159.16, 159.15, 159.19

[56] References Cited

U.S. PATENT DOCUMENTS 3,840,390 10/1974 Kozu et al. ............................ 430/285
3,953,214 4/1976 Lipson et al. ........................ 430/281

Primary Examiner—Jack P. Brammer
Attorney, Agent, or Firm—Blanchard, Flynn, Thiel, Boutell & Tanis

[57] ABSTRACT

A photosensitive composition comprising polyester, a half-esterified hydroxy alkyl acrylate (or methacrylate) of polybasic acid (or its anhydride), an ethylenic unsaturated bond-having vinyl monomer and a photo-polymerization initiator is especially useful for processing printed circuit boards.

4 Claims, No Drawings

PHOTOPOLYMERIZABLE POLYESTER CONTAINING COMPOSITIONS

BACKGROUND OF THE INVENTION a. Field of the Invention

This invention relates to photo-polymerizable compositions which, when exposed to light, form coated films capable of resisting the aqueous solutions employed in etching printed circuit boards, such as solutions of ferric chloride, cupric chloride, ammonium persulfate, nitric acid and so forth, said coated films being strippable only by dipping them in a dilute alkaline aqueous solution for a very short period of time and swelling them thereby.

b. Description of the Prior Art

The compositions which have hitherto been used in etching printed circuit boards were those of the heat drying type containing a volatile solvent consisting essentially of a rosin soluble in a dilute alkaline aqueous solution, a maleic acid-modified rosin and a phenol novolak resin. The dry coated film using therein the composition of this type is readily strippable with a dilute alkaline aqueous solution (which is stripped in a 1–3% NaOH aqueous solution in a short time such as in less than 10 seconds), but, because of its hardness being HB or less in terms of pencil hardness, it suffers many damages during processing steps in fabricating printed circuit boards, thereby inducing a number of breakings of wire in circuits of printed circuit boards. In addition, when screen printing a 0.2 m/m or less narrow lines carrying pattern by using the composition of this type which contains therein a volatile solvent, the ink dries on the screen and causes a clogging of the pores on the screen, whereby the printing of circuits becomes impossible and a number of breakings of wire in circuits of printed circuit boards take place as mentioned above.

U.S. Pat. No. 3,953,214 has already proposed to overcome the aforesaid disadvantages. This patent discloses a composition comprising polyester, hydroxyalkyl acrylate (or methacrylate), a photopolymerizable monomer, a carboxylic acid having 2–36 carbon atoms and a photo-initiator, wherein the polyester acts to impart acid-resistance and hardness to a coated film while the hydroxyalkyl acrylate (or methacrylate) and carboxylic acid having 2–36 carbon atoms act to improve the removability of the film with a dilute alkaline solution. In the composition according to this patent, in order to improve the acid resistance and hardness of the coated film, it is necessary to increase the content of the polyester. However, this is disadvantageous in that the time required for stripping the film with a dilute alkaline solution is prolonged, for instance, such as 10 minutes or more at normal room temperature and 2 minutes or more at 50° C., which is substantially equivalent to ten times or more the stripping time required in the conventional heat drying type compositions. On the other hand, the addition of the hydroxyalkyl acrylate (or methacrylate) and the carboxylic acid having 2–36 carbon atoms in increased quantities for the purpose of shortening the aforesaid stripping time is serviceable for improving the strippability of the cured coated film with a dilute alkaline solution, but acts to deteriorate the acid resisting property of the film and further lowers the hardness thereof, so that said film can not be put to practical use.

SUMMARY OF THE INVENTION

I have carried out various studies with the intention of overcoming the above mentioned disadvantages and discovered that the use of a photopolymerizable composition comprising polyester, a half-esterified hydroxyalkyl acrylate (or methacrylate) of polybasic acid (or its anhydride), an ethylenic unsaturated bond having vinyl monomer and a photo-polymerization initiator make it possible to obtain a coated film which has the strippability, using a dilute alkaline solution, equivalent to those of films formed using conventional heat drying type compositions and further has a hardness of HB or more in the terms of pencil hardness.

The polyesters which may be used in the present invention are the reaction product of a polybasic acid (or its anhydride) and a polyhydric alcohol. The above mentioned polybasic acid (or its anhydride) includes adipic acid, sebacic acid, azelaic acid, dodecane dicarboxylic acid, dimer acid, maleic anhydride, fumaric acid, itaconic acid, citraconic acid, phthalic anhydride, isophthalic acid, terephthalic acid, tetrahydrophthalic anhydride, hexahydrophthalic anhydride, methyltetrahydrophthalic anhydride, hexachlorophthalic anhydride, trimellitic anhydride, pyromellitic anhydride and the like. The polyhydric alcohols which may be used in the present invention include ethylene glycol, diethylene glycol, triethylene glycol, polyethylene glycol, propylene glycol, dipropylene glycol, tripropylene glycol, polypropylene glycol, 1,3-butylene glycol, 2,3-butylene glycol, 1,4-butylene glycol, 1,5-hexanediol, 1,6-hexanediol, neopentyl glycol, glycerine, trimethylolpropane, pentaerythritol, trimethylolethane, tetramethylene glycol, hexamethylene glycol and the like. Preferred polyesters used in the present invention are the reaction products between the above mentioned polybasic acids (or anhydrides thereof) and polyhydric alcohols, wherein the molar ratio of an unsaturated polybasic acid (or its anhydride) to a saturated polybasic acid (or its anhydride) is in the range of 50:50–95:5, the molar ratio of an aromatic polybasic acid (or its anhydride) to an aliphatic polybasic acid (or its anhydride) from among the above polybasic acids (or anhydrides thereof) is in the range of 100:0–50:50 and the molar ratio of a polybasic acid (or its anhydride) to a polyhydric alcohol is in the range of 50:50–45:55. In the preparation of the aforesaid polyesters there may be employed any conventional process in which an acid component is reacted with a glycol component at temperatures of 50°–200° C. and normal pressures in a $CO_2$ or $N_2$ gas atmosphere. In the case where two kinds or more of acid components or alcohol components are different in reactivity from each other and the like, it is also acceptable to add the component of low reactivity preferentially and successively add the other components in the reaction system, thereby effecting the condensation reaction gradually under the same reaction conditions as mentioned above.

The half-esterified hydroxy alkyl acrylate (or methacrylate) of polybasic acid (or its anhydride), the secondary component of the composition of the present invention, is obtained as a equimolar reaction product of a polybasic acid (or its anhydride) and hydroxy alkyl acrylate (or methacrylate). As the polybasic acid (or its anhydride) there can be employed those previously enumerated in the explanation of the polyester, and as the hydroxy alkyl group-containing acrylate or methacrylate there can be employed hydroxymethyl acrylate, 2-hydroxyethyl acrylate, 2-hydroxypropyl acrylate, 3-hydroxypropyl acrylate, 2-hydroxy-3-chloropropyl acrylate, 2-hydroxybutyl acrylate, diethylene glycol monoacrylate, glycerin diacrylate, pentaerythritol triacrylate and methacrylates corresponding thereto. Hereinafter, will be shown synthesis examples of the half-esterified hydroxy alkyl acrylate (or methacrylate) of polybasic acid.

Synthesis examples of the half-esterified hydroxy alkyl acrylate (or methacrylate) of polybasic acid:

SYNTHESIS EXAMPLE A 144 g (1 mol) of 2-hydroxyethyl methacrylate and 154 g (1 mol) of hexahydrophthalic anhydride were reacted at a temperature of 90°–100° C. for 5 hours in the presence of 0.1 g of hydroquinone monomethyl ether to thereby obtain a half-esterified product having an acid number of 195.

SYNTHESIS EXAMPLE B 116 g (1 mol) of 2-hydroxyethyl acrylate and 148 g (1 mol) of phthalic anhydride were reacted at a temperature of 80°–90° C. for 6 hours in the presence of 0.2 g of p-methoxyphenol to thereby obtain a half-esterified product having an acid number of 215.

SYNTHESIS EXAMPLE C 200 g (1 mol) of glycerine diacrylate and 98 g (1 mol) of maleic anhydride were reacted at a temperature of 90°–100° C. in the presence of 0.1 g of hydroquinone to thereby obtain a half-esterified product having an acid number of 190.

SYNTHESIS EXAMPLE D 144 g (1 mol) of 2-hydroxyethyl methacrylate and 170 g (1 mol) of methyltetrahydrophthalic anhydride (or 3 or 4-methyl1,2,3,6-tetrahydrophthalic anhydride) were mixed at a temperature of 90°–100° C. in the presence of 0.1 g of hydroquinone to thereby obtain a half-esterified product having an acid number of 180.

Next, the ethylenic unsaturated double bond-containing vinyl monomers which may be used in the present invention include methoxyethyl acrylate (or methacrylate), ethoxyethyl acrylate (or methacrylate), butoxyethyl acrylate (or methacrylate), methoxyethyl acrylate (or methacrylate), stearyl acrylate (or methacrylate), lauryl acrylate (or methacrylate), tetrahydrofurfuryl acrylate (or methacrylate), benzyl acrylate (or methacrylate), phenoxyethyl acrylate (or methacrylate), 2-hydroxyethyl acryloyl (or methacryloyl) phosphate, 2-hydroxyethyl acrylate (or methacrylate), 2-hydroxypropyl acrylate (or methacrylate), ethylene glycol diacrylate (or dimethacrylate), diethylene glycol diacrylate (or dimethacrylate), triethylene glycol diacrylate (or dimethacrylate), polyethylene glycol diacrylate (or dimethacrylate), propylene glycol diacrylate (or dimethacrylate), polypropylene glycol diacrylate (or dimethacrylate), 1,6-hexanediol diacrylate (or dimethacrylate), trimethylolpropane triacrylate (or trimethacrylate), 2-ethylhexyl acrylate (or methacrylate), 1,3-butylene glycol diacrylate (or dimethacrylate), 1,4-butylene glycol diacrylate (or dimethacryl-) ate), neopentyl glycol diacrylate (or dimethacrylate), dipropylene glycol diacrylate (or dimethacrylate), tetramethylolmethane triacrylate (or trimethacrylate), tetramethylolmethane tetraacrylate (or tetramethacrylate), hydroxypivalic acid neopentyl glycol diacrylate (or dimethacrylate), dipentaerythritol hexaacrylate (or hexamethacrylate) and the like.

The photo-polymerization initiators which may used in the present invention include α-carbonyl alcohols such as benzoin, butyloin, trioin, acetoin, etc.; acyloin ethers such as benzoin methyl ether, benzoin ethyl ether, benzoin isopropyl ether, benzoin isobutyl ether, pivaloin ethyl ether, anisoin ethyl ether, etc.; α-substituted acyloins such as α-methyl benzoin, α-phenyl benzoin, etc.; polynuclear quinones such as 9,10-anthraquinone, 2-chloroanthraquinone, 2-methylanthraquinone, 2-ethylanthraquinone, 1,4-naphthoquinone, 2,3-benzanthraquinone, etc.; vicinal polyketone compounds such as diacetyl, dibenzoyl, diphenyl ketone, phenylglyoxal, pentadione-2,3, 1-phenylbutanedione-1,2, octadione-2,3, diphenyl triketone, etc.; aromatic ketones such as benzophenone, ω-bromoacetophenone, 2-hydroxy-2-methyl propiophenone, 4'-isopropyl-2-hydroxy-2-methyl propiophenone, 2,2-dimethoxy-2-phenylacetophenone, p-tertbutyltrichloroacetophenone, p-tert-butylmonochloroacetophenone, 2,2-diethoxyacetophenone, 4,4'-bis-dialkylaminobenzophenones, etc.

The stabilizers which may be added to improve the storage stability of the composition of the present invention include p-methoxyphenol, hydroquinone, alkyl- and aryl-substituted hydroquinone, cuprous chloride, naphthylamine, phenothiazine, pyrogallol, etc. Depending on the uses, furthermore, may be added tackifiers, leveling agents, fluidity improving agents, flatting agents, coupling agents, plasticizers, thermo-plastic resins, pigments, dyestuffs, fillers and the like.

DESCRIPTION OF THE PREFERRED EMBODIMENTS

Next, the aforegoing will be explained concretely with reference to control examples and examples for embodying the present invention as shown below.

CONTROL EXAMPLE 1

80 g (1.05 mol) of propylene glycol, 66 g (0.4 mol) of isophthalic acid and 70 g (0.6 mol) of maleic anhydride were subjected to 13 hours' reaction in a $N_2$ gas atmosphere at a temperature of 50°–200° C., thereby obtaining a polyester having a softening point of 81° C. and an acid number of 37. A composition comprising 39.1 wt.% of this polyester, 19.6 wt.% of 2-hydroxyacrylate (as hydroxy alkyl acrylate), 6.5 wt.% of 1,6-hexanediol diacrylate (as an ethylenic unsaturated bond-containing vinyl monomer), 5.0 wt.% of benzoinisobutyl ether (as a photopolymerization initiator), 28.4 wt.% barium sulfate (as a filler), 1.2 wt.% of Modaflow (as a leveling agent available from Monsanto Chemical Co.) and 0.2 wt.% of Methyl Violet (as a dyestuff) was applied onto the copper foil of a printed circuit board in accordance with the screen printing process and ultravioletcured, thereby obtaining a sample whose coated film has a pencil hardness of 2H. This sample was treated respectively with the ferric chloride etchant, the cupric chloride etchant and the ammonium persulfate etchant at a temperature of 40°–50° C. for a period of 20 minutes. Inspection showed that the samples exhibited a satisfactory chemical resistance respectively. Thereafter, the coated film was stripped in a 3% aqueous solution of sodium hydroxide. It took more than 120 seconds until the stripping is completed.

CONTROL EXAMPLE 2

A composition comprising 29.1 wt.% of the same polyester as employed in Control Example 1, 23.1 wt.% of 2-hydroxyethyl acrylate, 3.0 wt.% of 1,6-hexanediol diacrylate, 10.0 wt.% of itaconic acid, 5.0 wt.% of benzoinisobutyl ether, 28.4 wt.% of barium sulfate, 1.2 wt.% of Modaflow and 0.2 wt.% of Methyl Violet was applied onto the copper foil of a printed circuit board in accordance with the screen printing process and ultraviolet-cured, thereby obtaining a sample whose coated film has a pencil hardness of B. Thereafter, the coated film of this sample was stripped in a 3% aqueous solution of sodium hydroxide at a temperature of 55° C. Inspection showed that this sample could endure at most about 5 minutes' treatment with the etchants employed in Control Example 1.

EXAMPLE 1

A composition comprising 16.7 wt.% of the same polyester as employed in Control Example 1, 30.1 wt.% of the half-esterified product of Synthesis Example A, 14.7 wt.% of diethylene glycol diacrylate (as an ethylenic bond-containing vinyl monomer), 5 wt.% of benzoinisobutyl ether, 31.0 wt.% of barium sulfate (as a filler), 2.0 wt.% of Modaflow (as a leveling agent) and 0.5 wt.% of Cyanine Green (as an organic pigment) was applied onto the copper foil of a printed circuit board in accordance with the screen printing process and ultraviolet-cured, thereby obtaining a sample whose coated film has a pencil hardness of 2H. This sample was treated respectively with the ferric chloride etchant, the cupric chloride etchant and the ammonium persulfate etchant for a period of 20 minutes. Inspection showed the respective samples showed a satisfactory chemical resistance. Thereafter, the coated film of this sample was stripped in a 3% aqueous solution of sodium hydroxide at a temperature of 55° C. It took 20 seconds until the stripping is completed.

EXAMPLE 2

80 g (1.05 mol) of propylene glycol, 25 g (0.15 mol) of isophthalic acid and 99 g (0.85 mol) of maleic anhydride were subjected to 13 hours' reaction in a $N_2$ gas atmosphere at a temperature of 50°-200° C., thereby obtaining a polyester having a softening point of 63° C. and an acid number of 55. A composition comprising 12.0 wt.% of this polyester, 35.1 wt.% of the half-esterified product of Synthesis Example A, 2.0 wt.% of trimethylolpropane triacrylate, 10.0 wt.% of 2-hydroxypropyl methacrylate, 33.4 wt.% of barium sulfate, 5.0 wt.% of benzoinisobutyl ether, 2.0 wt.% of Modaflow and 0.5 wt.% of Cyan Green was subjected to the same treatment as employed in Example 1, thereby obtaining a sample. Inspection showed that the coated film of the thus obtained sample had a pencil hardness of 2H, could endure the treatment with the respective etchants for a period of 20 minutes or more and was stripped in 5 seconds in a 3% aqueous solution of sodium hydroxide at a temperature of 55° C.

EXAMPLE 3

210 g (1.05 mol) of polypropylene glycol, 50 g (0.3 mol) of isophthalic acid and 81 g (0.7 mol) of maleic anhydride were subjected to 15 hours' reaction in a $N_2$ gas atmosphere at a temperature of 50°-200° C. to thereby obtain a polyester having a softening point of 56° C. and an acid number of 37. A composition comprising 12.0 wt.% of this polyester, 35.1 wt.% of the half-esterified product of Synthesis Example B, 2.0 wt.% of trimethylolpropane triacrylate, 10.0 wt.% of 2-hydroxyethyl acrylate, 33.4 wt.% of barium sulfate, 5.0 wt.% of benzoinisobutyl ether, 2.0 wt.% of Modaflow and 0.5 wt.% of Cyanin Green was subjected to the same treatment as employed in Example 1 to obtain a sample. Inspection showed that the coated film of the sample thus obtained had a pencil hardness of HB, could endure the treatment with the respective etchants for a period of 20 minutes or more and was stripped in 5 seconds in a 3% aqueous solution of sodium hydroxide at a temperature of 55° C.

EXAMPLE 4

65 g (1.05 mol) of ethylene glycol, 50 g (0.3 mol) of phthalic acid and 81 g (0.7 mol) of fumaric acid were subjected to 10 hours' reaction at a temperature of 50°-200° C. to obtain a polyester having a softening point of 60° C. and an acid number of 57. A composition comprising 15.0 wt.% of this polyester, 33.8 wt.% of the half-esterified product of Synthesis Example C, 14.7 wt.% of p-tert-butyl-monochloroacetophenone diacrylate, 3 wt.% of p-tert-butyl-monochloroacetophenone, 31.0 wt.% of barium sulfate, 2.0 wt.% of Modaflow and 0.5 wt.% of Cyanin Green was subjected to the same treatment as employed in Example 1 to obtain a sample. Inspection showed that the coated film of the sample thus obtained had a pencil hardness of 2H, could endure the treatment with the respective etchants for a period of 20 minutes or more and was stripped in 10 seconds in a 3% aqueous solution of sodium hydroxide at a temperature of 55° C.

EXAMPLE 5

A composition comprising 16.7 wt.% of the same polyester as employed in Example 4, 32.1 wt.% of the half-esterified product of Synthesis Example D, 14.7 wt.% of ethylene glycol monoethyl ether acrylate, 3 wt.% of p-tert-butyl-monochloroacetophenone, 31.0 wt.% of barium sulfate, 2.0 wt.% of Modaflow and 0.5 wt.% of Cyanin Green was subjected to the same treatment as employed in Example 1 to obtain a sample. Inspection showed that the coated film of the sample thus obtained had a pencil hardness of 2H, could endure the treatment with the respective etchants for a period of 20 minutes or more and was stripped in a 3% aqueous solution of sodium hydroxide at a temperature of 55° C. in 10 seconds.

In the photosensitive composition, the weight ratio of the polyester to the half-esterified product is in the range of from 25:75 to 85:15; the weight ratio of a mixture of said polyester and half-esterified product to the vinyl monomer is in the range of from 30:70 to 90:10; and the weight ratio of a mixture of said polyester, half-esterified product and vinyl monomer to the photopolymerization initiator is in the range of from 90:10 to 99.5:0.5.

What is claimed is:

1. A photosensitive composition, which comprises:
    (a) polyester reaction product of the reaction between a polybasic acid component selected from the group consisting of polybasic acids and anhydrides thereof, and a polyhydric alcohol component,
    (b) half-ester reaction product of the reaction between equimolar amounts of a polybasic acid component selected from the group consisting of polybasic acids and anhydrides thereof, and monohydroxyalkyl acrylate or monohydroxyalkyl methacrylate, (c) vinyl monomer selected from the group consisting of methoxyethyl acrylate, methoxyethyl methacrylate, ethoxyethyl acrylate, ethoxyethyl methacrylate, butoxyethyl acrylate, butoxyethyl methacrylate, stearyl acrylate, stearyl methacrylate, lauryl acrylate, lauryl methacrylate, tetrahydrofurfuryl acrylate, tetrahydrofurfuryl methacrylate, benzyl acrylate, benzyl methacrylate, phenoxyethyl acrylate, phenoxyethyl methacrylate, 2-hydroxyethyl acryloyl phosphate, 2-hydroxyethyl methacryloyl phosphate, 2-hydroxyethyl acrylate, 2-hydroxyethyl methacrylate, 2-hydroxypropyl acrylate, 2-hydroxypropyl methacrylate, ethylene glycol diacrylate, ethylene glycol dimethacrylate, diethylene glycol diacrylate, diethylene glycol dimethacrylate, triethylene glycol diacrylate, triethylene glycol dimethacrylate, polyethylene glycol diacrylate, polyethylene glycol dimethacrylate, propylene glycol diacrylate, propylene glycol dimethacrylate, polypropylene glycol diacrylate, polypropylene glycol dimethacrylate, 1,6-hexanediol diacrylate, 1,6-hexanediol dimethacrylate, trimethylolpropane triacrylate, trimethylolpropane trimethacrylate, 2-ethylhexyl acrylate, 2-ethylhexyl methacrylate, 1,3-butylene glycol diacrylate, 1,3-butylene glycol dimethacrylate, 1,4-butylene glycol diacrylate, 1,4-butylene glycol dimethacrylate, neopentyl glycol diacrylate, neopentyl glycol dimethacrylate, dipropylene glycol diacrylate, dipropylene glycol dimethacrylate, tetramethylolmethane triacrylate, tetramethylolmethane trimethacrylate, tetramethylolmethane tetraacrylate, tetramethylolmethane tetramethacrylate, hydroxypivalic acid neopentyl glycol diacrylate, hydroxypivalic acid neopentyl glycol dimethacrylate, dipentaerythritol hexaacrylate and dipentaerythritol hexamethacrylate, and (d) a photopolymerization initiator, wherein the weight ratio of a:b is from 25:75 to 85:15, the weight ratio of (a+b):c is from 30:70 to 90:10 and the weight ratio of (a+b+c):d is from 90:10 to 99.5:0.5.

2. A photosensitive composition as claimed in claim 1 in which the polyester (a) is prepared using, as the polybasic acid component, a mixture of (i) unsaturated polybasic acid or anhydride thereof and (ii) saturated polybasic acid or anhydride thereof, wherein the molar ratio of (i):(ii) is from 50:50 to 95:5, the molar ratio of aromatic polybasic acid or anhydride thereof:aliphatic polybasic acid or anhydride thereof is from 100:0 to 50:50, and the molar ratio of said polybasic acid component:polyhydric alcohol component is from 50:50 to 45:55.

3. A photosensitive composition as claimed in claim 1 or claim 4 in which said polybasic acids and anhydrides thereof are selected from the group consisting of adipic acid, sebacic acid, azelaic acid, dodecane dicarboxylic acid, dimer acid, maleic anhydride, fumaric acid, itaconic acid, citraconic acid, phthalic anhydride, isophthalic acid, terephthalic acid, tetrahydrophthalic anhydride, hexahydrophthalic anhydride, methyltetrahydrophthalic anhydride, hexachlorophthalic anhydride, trimellitic anhydride and pyromellitic anhydride.

4. A photosensitive composition as claimed in claim 3 in which said monohydroxyalkyl acrylate and monohydroxyalkyl methacrylates are selected from the group consisting of hydroxymethyl acrylate, hydroxymethyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxy-3-chloropropyl acrylate, 2-hydroxy-3-chloropropyl methacrylate, 2-hydroxybutyl acrylate, 2-hydroxybutyl methacrylate, diethylene glycol monoacrylate, diethylene glycol monomethacrylate, glycerin diacrylate, glycerin dimethacrylate, pentaerythritol triacrylate and pentaerythritol trimethacrylate.

* * * * *

UNITED STATES PATENT AND TRADEMARK OFFICE
CERTIFICATE OF CORRECTION

PATENT NO. : 4 293 636
DATED : October 6, 1981
INVENTOR(S) : Ken Okuya

It is certified that error appears in the above—identified patent and that said Letters Patent is hereby corrected as shown below:

Column 8, Line 17; change "4" to ---2---.

Signed and Sealed this

Nineteenth Day of January 1982

[SEAL]

Attest:

Attesting Officer

GERALD J. MOSSINGHOFF
Commissioner of Patents and Trademarks